United States Patent [19]

Fredrickson

[11] 4,225,797
[45] Sep. 30, 1980

[54] PULSE GENERATOR CIRCUIT TRIGGERABLE BY NUCLEAR RADIATION

[75] Inventor: Paul B. Fredrickson, Sudbury, Mass.

[73] Assignee: GTE Products Corporation, Stamford, Conn.

[21] Appl. No.: 912,133

[22] Filed: Jun. 2, 1978

[51] Int. Cl.$^2$ .............................................. H03K 3/00
[52] U.S. Cl. ................................ 307/278; 307/308; 307/311
[58] Field of Search ...................... 307/278, 308, 311; 250/370, 390; 331/66

[56] References Cited

U.S. PATENT DOCUMENTS

| 3,349,252 | 10/1967 | Briley | 250/390 |
| 3,479,509 | 11/1969 | Grundy et al. | 331/66 |
| 3,602,742 | 8/1971 | Husa | 307/278 |
| 3,715,608 | 2/1973 | Glorioso | 307/308 |

OTHER PUBLICATIONS

"Light Sensitive Oscillator" by Huang in IBM Tech. Discl. Bull., vol. 8, No. 4, Sep. 1965.

Primary Examiner—Stanley D. Miller, Jr.
Assistant Examiner—B. P. Davies
Attorney, Agent, or Firm—Peter Xiarhos

[57] ABSTRACT

A pulse generator circuit triggerable by a pulse of nuclear radiation. The pulse generator circuit includes a pair of transistors arranged, together with other electrical components, in the topology of a standard monostable multivibrator circuit. The circuit differs most significantly from a standard monostable multivibrator circuit in that the circuit is adapted to be triggered by a pulse of nuclear radiation rather than electrically and the transistors have substantially different sensitivities to radiation, due to different physical and electrical characteristics and parameters.

One of the transistors is employed principally as a radiation detector and is in a normally non-conducting state and the other transistor is normally in a conducting state. When the circuit is exposed to a pulse of nuclear radiation, currents are induced in the collector-base junctions of both transistors but, due to the different radiation sensitivities of the transistors, the current induced in the collector-base junction of the radiation-detecting transistor is substantially greater than that induced in the collector-base junction of the other transistor. The pulse of radiation causes the radiation-detecting transistor to operate in its conducting state, causing the other transistor to operate in its non-conducting state. As the radiation-detecting transistor operates in its conducting state, an output signal is produced at an output terminal connected to the radiation-detecting transistor indicating the presence of a predetermined intensity of nuclear radiation.

12 Claims, 1 Drawing Figure

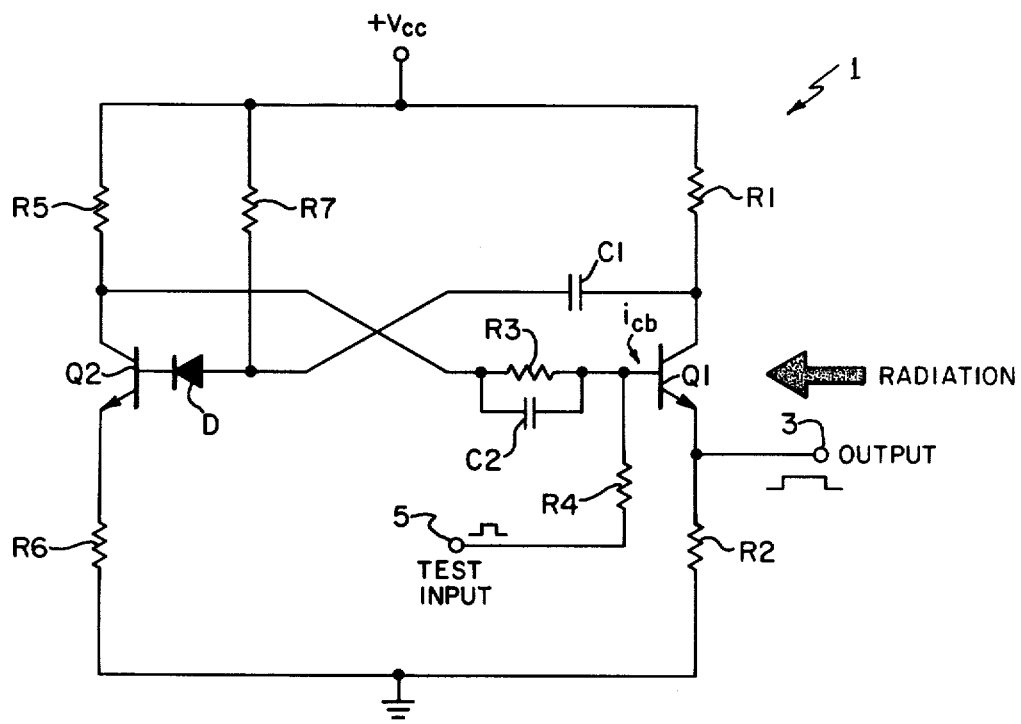

PULSE GENERATOR CIRCUIT TRIGGERABLE BY NUCLEAR RADIATION

The invention herein described was made in the course of a contract with the Department of the Army.

BACKGROUND OF THE INVENTION

The present invention relates to a pulse generator circuit and, more particularly, to a pulse generator circuit triggerable by a pulse of nuclear radiation.

Circuits triggerable by nuclear radiation are well known to those skilled in the art. These circuits commonly include a radiation detector device such as a radiation-responsive semiconductor diode and amplifier and shaping circuitry for amplifying and shaping (e.g., lengthening) the output signal of the radiation detector device. While these circuits generally perform in a satisfactory manner, they have several disadvantages and drawbacks. For example, the radiation detector devices employed in these circuits are generally specially-designed devices and, therefore, costly, and in many cases require non-standard biasing operating voltages which can be supplied only by special power supplies. In addition, these radiation detection devices are limited in the degree to which they can be integrated with other circuits, the designer being generally limited only to choosing the size of an output resistor of the detector device. If this resistor does not provide sufficient range then either additional amplification must be provided or another detector type must be selected. An additional disadvantage of many commercially-available detector devices is that they can be tested only by direct exposure to nuclear radiation. Other available detector devices, because of their particular design, can be tested electrically only with substantial difficulty. When detector devices as described above are used with special power supplies and amplifier and shaping circuitry for processing the output signals of the detector devices, adequate space provision must be made for housing or containing all of these components, for example, on a printed circuit board, and, in addition, adequate venting must be provided for carrying away heat normally produced by the special power supplies and added circuits.

BRIEF SUMMARY OF THE INVENTION

In accordance with the present invention, a radiation-triggerable pulse generator circuit is provided which avoids the disadvantages and shortcomings of prior art arrangements as discussed hereinabove. The pulse generator circuit in accordance with the invention includes first and second transistors of the same conductivity type, each having a base, emitter and collector. The physical and electrical characteristics and parameters of the transistors are such that the first transistor has a sensitivity to radiation substantially greater than the sensitivity to radiation of the second transistor.

The pulse generator circuit further includes a biasing means coupled to the first and second transistors. The biasing means operates in the absence of the first and second transistors being exposed to a pulse of nuclear radiation to bias the first transistor into a first conducting state and to bias the second transistor into a second, opposite conducting state. When the first transistor is exposed to a pulse of nuclear radiation, it operates to switch from the first conducting state to the second conducting state and to establish an induced current in the collector-base junction thereof. The second transistor also operates in response to being exposed to the pulse of nuclear radiation to establish an induced current in the collector-base junction thereof. However, by virtue of the different radiation sensitivities of the first and second transistors, the value of the induced current established in the collector-base junction of the first transistor is substantially greater than the value of the induced current established in the collector-base junction of the second transistor.

As the first transistor is caused to operate in the second conducting state, a feedback circuit means interconnecting the collector of the first transistor and the base of the second transistor operates to cause the second transistor to switch from the second conducting state to the first conducting state. During the time that the first transistor operates in its second conducting state, it operates to produce an output signal at an output terminal connected thereto indicating that the pulse generator circuit and the first transistor included therein have been exposed to a pulse of nuclear radiation.

BRIEF DESCRIPTION OF THE DRAWING

The single FIGURE illustrates a pulse generator circuit triggerable by nuclear radiation in accordance with the present invention.

DETAILED DESCRIPTION OF THE INVENTION

Referring now to the single FIGURE of the drawing, there is shown a pulse generator circuit 1 in accordance with the invention. The pulse generator circuit 1 includes a standard npn transistor Q1 adapted to serve as a radiation detector device for the pulse generator circuit 1 and to produce an output pulse at an output terminal 3 in response to being exposed to a pulse of nuclear radiation. The transistor Q1 is selected, together with the other components of the pulse generator circuit 1, to be described in detail hereinafter, so that the output pulse produced at the output terminal 3 in response to the transistor Q1 being exposed to a pulse of nuclear radiation has a pulse width exceeding the duration of the pulse of nuclear radiation received by the radiation-detecting transistor Q1.

As shown in the FIGURE, the collector of the transistor Q1 is connected through a resistance R1 to a positive voltage supply + Vcc and through a series arrangement of a feedback capacitance C1 and a diode D to the base of a second standard npn transistor Q2. The emitter of the transistor Q1 is connected to the output terminal 3 and through a resistance R2 to ground potential, and the base is connected through a parallel feedback arrangement of a resistance R3 and a capacitance C2 to the collector of the transistor Q2. The base of the transistor Q1 is also connected through a resistance R4 to a test input terminal 5 by which the operation of the transistor Q1 and the circuit 1 may be tested electrically, that is, without actually exposing the transistor Q1 to nuclear radiation. The abovementioned resistance R1 is a threshold-setting resistance and serves to set, or establish, the level of radiation at which the transistor Q1 will have a current induced therein, specifically, in the collector-base junction of the transistor Q1, in response to the transistor Q1 being exposed to a pulse of nuclear radiation. The value of the resistance R1 may be varied over a wide range for establishing a wide range of values of radiation to which the pulse generator circuit 1 will respond.

The collector of the transistor Q2, in addition to being coupled to the base of the transistor Q1 via the resistance R3 and the capacitance C2, is also connected through a resistance R5 to the positive voltage supply + Vcc, and the emitter of the transistor Q2 is connected through a resistance R6 to ground potential. The juncture of the anode of the diode D and the capacitance C1 is connected through a resistance R7 to the positive voltage supply + Vcc.

It will be appreciated that the pulse generator circuit 1 as briefly described hereinabove and shown in the drawing is similar from a component topology standpoint to a standard monostable multivibrator circuit. The pulse generator circuit 1 of the invention differs most significantly from a standard monostable multivibrator circuit in that it is triggered by a pulse of nuclear radiation rather than electrically and in that the transistors Q1 and Q2, instead of having the same physical and electrical characteristics and parameters, as is normally the case with standard monostable multivibrator circuits, are selected to have substantially different physical and electrical characteristics and parameters whereby the transistors Q1 and Q2 are made to have substantially different radiation-response capabilities. More specifically, the transistor Q1 is selected to have a substantially greater sensitivity to radiation, for example, by a factor of greater than 10 to 1, than the transistor Q2. This difference in sensitivity is determined by such factors as the physical parameters and characteristics (e.g., physical size and junction widths of the transistors Q1 and Q2) and electrical parameters (including the beta of the transistor Q1). As a result of the above differences, when the pulse generator circuit 1 is exposed to a pulse of nuclear radiation, in which case the transistor Q1 will principally respond to the radiation and the other transistor Q2 incidentally to a much lesser degree, the current induced in the collector-base junction of the transistor Q1 will exceed the current induced in the collector-base junction of the transistor Q2 by a substantial margin, for example, by a factor of at least 10 to 1 and, more preferably, by a factor of about 100 to 1. The significance of the use of the transistors Q1 and Q2 of different radiation-response characteristics will be more readily apparent hereinafter.

In the quiescent operating state of the pulse generator circuit 1, that is, in the absence of a pulse of nuclear radiation being applied to the pulse generator circuit 1, the transistor Q1 is in a non-conducting ("off") state and the transistor Q2 is in a conducting ("on") state. The transistor Q2 is caused to operate in its conducting state by means of current in a path extending from the positive voltage supply + Vcc, through the biasing resistance R7, the diode D, the base-emitter junction of the transistor Q2 and the resistance R6 to ground potential. With the transistor Q2 in its conducting state, the voltage at its collector is at a low value and is coupled into the base of the transistor Q1 via the resistance R3. The low voltage at the base of the transistor Q1 serves to cause the transistor Q1 to operate in its non-conducting state. The resistance R3 serves to insure that the transistor Q1 operates in its non-conducting state.

In the non-quiescent operating state of the pulse generator circuit 1, that is, when the pulse generator circuit 1 is exposed to a pulse of nuclear radiation, the transistor Q1 receives this pulse of radiation and is caused to switch from its non-conducting state to its conducting state. The pulse of radiation induces a current $i_{cb}$ in the collector-base junction of the transistor Q1. As the transistor Q1 is caused to operate in its conducting state due to the pulse of radiation, the transistor Q2 is also exposed to this pulse of radiation so that a current is also induced in the collector-base junction of this transistor. However, as previously mentioned, because of the different radiation-response characteristics of the two transistors Q1 and Q2, the current induced in the collector-base junction of the transistor Q2 is substantially less than the current induced in the collector-base junction of the transistor Q1, as a result of which the conducting state of the transistor Q2 is aided only minimally. The induced current in the transistor Q2 is insufficient, for example, to cause the transistor Q2 to operate in saturation.

With the transistor Q1 operating in its conducting state, the voltage at its collector drops substantially. This action produces a negative voltage at the base of the transistor Q2 causing this transistor to switch from its conducting state (as aided minimally by the induced current therein) to its non-conducting state. The diode D serves to insure the turn-off of the transistor Q1 by preventing the breakdown of the base-emitter junction of the transistor Q2. As the transistor Q2 operates in its non-conducting state, its collector voltage rises and this voltage is coupled via the resistance R3 to the base of the transistor Q1. This voltage, in conjunction with the capacitance C2, causes the transistor Q1 to operate more fully in its conducting state thereby stabilizing it in its conducting state.

During the time that the transistor Q1 operates in its conducting state, the current $i_{cb}$ induced in its collector-base junction by the pulse of radiation is amplified by the beta of the transistor Q1 so that the current in the emitter circuit of the transistor Q1 has a value equal to the magnitude of the induced current $i_{cb}$ times the value of the beta of the transistor Q1. The emitter current of the transistor Q1 passes through the resistance R2 causing a voltage pulse to be produced thereacross and at the output terminal 3 indicative of the fact that the pulse generator circuit 1 was exposed to a pulse of nuclear radiation of a predetermined intensity. The duration of the output pulse produced at the output terminal 3 is determined by, and proportional to, the values of the biasing resistance R7 and the feedback capacitance C1. As mentioned previously, by appropriate selection of the value of the resistance R1 in the collector circuit of the transistor Q1, the intensity of the pulse of radiation to which the transistor Q1 will respond may be established at any one of several possible values. If increased sensitivity to the pulse of radiation is required, (that is, a lower trigger threshold), additional transistors (not shown) may be connected in parallel with the transistor Q1 as shown in the drawing so that the currents induced in all of the transistors become additive in effect.

The pulse generator circuit 1 and the transistor Q1 as described hereinabove may be tested to determined their operability without actually exposing the transistor Q1 to a pulse of nuclear radiation. To test the pulse generator circuit 1 and the transistor Q1, it only becomes necessary to apply a test signal to the test input terminal 5 of the pulse generator circuit 1. This test signal causes the transistor Q1 to switch from its quiescent non-conducting state to its conducting state at which time the output pulse produced by this action at the output terminal 3 may be electrically examined as to its amplitude and duration.

It will now be appreciated that a pulse generator circuit 1 has been described which has the simplicity, in terms of number and types of components, of a standard, low-cost monostable multivibrator circuit but is capable of being triggered by a pulse of nuclear radiation. No specially-designed radiation-responsive devices are required, the transistors Q1 and Q2 being standard, readily available commercial transistors. The amplification of currents induced in the transistor Q1 is provided automatically and inherently in the emitter circuit of the transistor Q1 and suitable pulse shaping, specifically, lengthening, of the output pulse produced at the output terminal 3 of the pulse generator circuit 1 is accomplished by simple components as normally used within a standard monostable multivibrator circuit, namely, the biasing resistance R7 and the feedback capacitance C1. Thus, no separate amplifiers and pulse shaping circuits as normally used with specially-designed radiation devices are required. Further, no special power supplies are required, the voltage supply + Vcc being a standard voltage supply capable of producing standard voltages (e.g., 5-30 volts dc). In addition, the pulse generator circuit 1 and the transistor Q1 may be readily and easily tested electrically, if desired, without actual exposure to nuclear radiation.

A pulse generator circuit 1 as described hereinabove was constructed to have the following components and values:

Q1—2N2222A (silicon)—beta of 100
Q2—2N2369A (silicon)—beta of 40
R1—1 k ohm
R2—360 ohms
R3—43 K ohms
R4—43 K ohms
R5—1.3 K ohms
R6—75 ohms
R7—43 K ohms
C1—2700 pf
C2—220 pf
D—1N4148
+ Vcc—10V d.c.

The pulse generator circuit 1 having the above components and values was exposed to a pulse of nuclear radiation of $10^7$ rads/sec for a duration of 20 nanoseconds. The output pulse produced at the output terminal 3 had an amplitude of 2.2V d.c. and a duration of 70 microseconds. The current $i_{cb}$ induced in the collector-base junction of the transistor Q1 exceeded the current induced in the collector-base junction of the transistor Q2 by a factor of approximately 100 to 1. The transistor Q1 switched from its quiescent non-conducting state to its conducting state within a few nanoseconds of the pulse of radiation reaching the abovespecified intensity of $10^7$ rads/sec.

While there has been described what is considered to be a preferred embodiment of the invention, it will be obvious to those skilled in the art that various changes and modifications may be made therein without departing from the invention as called for in the appended claims.

What is claimed is:

1. A pulse generator circuit triggerable by a pulse of nuclear radiation, comprising:

first and second transistors of the same conductivity type and each having electrodes including a base, emitter and collector, the physical and electrical characteristics and parameters of the first and second transistors being such that the first transistor has a sensitivity to radiation substantially greater than the sensitivity to radiation of the second transistor;

an output terminal connected to a predetermined electrode of the first transistor;

feedback circuit means interconnecting the collector of the first transistor and the base of the second transistor;

biasing means coupled to predetermined electrodes of the first and second transistors and operative in the absence of the first and second transistors being exposed to a pulse of nuclear radiation to bias the first transistor into a first conducting state and to bias the second transistor into a second, opposite conducting state;

said first transistor being operative in response to being exposed to a pulse of nuclear radiation to switch from the first conducting state to the second conducting state and to establish an induced current in the collector-base junction thereof, and said second transistor being operative in response to being exposed to the pulse of nuclear radiation to establish an induced current in the collector-base junction thereof, the value of the induced current established in the collector-base junction of the first transistor being substantially greater than the value of the induced current established in the collector-base junction of the second transistor;

said feedback circuit means being operative when the first transistor is caused to operate in the second conducting state to cause the second transistor to switch from the second conducting state to the first conducting state; and said first transistor being operative during the time that it operates in its second conducting state to produce an output signal at the output terminal connected thereto indicating that the pulse generator circuit and the first transistor included therein have been exposed to a pulse of nuclear radiation.

2. A pulse generator circuit in accordance with claim 1 further comprising:

additional feedback circuit means interconnecting the collector of the second transistor and the base of the first transistor and operative when the second transistor switches from the second conducting state to the first conducting state to cause the first transistor to operate more fully in the second conducting state.

3. A pulse generator circuit in accordance with claim 2 further comprising:

a test input coupled to the base of the first transistor for receiving a test signal for causing the first transistor to operate in the second conducting state in the absence of the first transistor being exposed to a pulse of nuclear radiation.

4. A pulse generator circuit in accordance with claim 2 wherein:

the physical and electrical characteristics and parameters of the first and second transistors are selected so that the first transistor has a sensitivity to radiation at least ten times the sensitivity to radiation of the second transistor.

5. A pulse generator circuit in accordance with claim 4 wherein:

the physical and electrical characteristics and parameters of the first and second transistors are selected so that the first transistor has a sensitivity to radiation of about 100 times the sensitivity to radiation of the second transistor.

6. A pulse generator circuit in accordance with claim 4 wherein:
   the feedback circuit means interconnecting the collector of the first transistor and the base of the second transistor includes a capacitance; and
   the additional feedback circuit means interconnecting the collector of the second transistor and the base of the first transistor includes a resistance.

7. A pulse generator circuit in accordance with claim 6 wherein:
   the feedback circuit means interconnecting the collector of the first transistor and the base of the second transistor further includes a diode in series with the capacitance; and
   the additional feedback circuit means interconnecting the collector of the second transistor and the base of the first transistor further includes a capacitance connected in parallel with the resistance.

8. A pulse generator circuit in accordance with claim 7 comprising:
   a resistance connected in the emitter circuit of the first transistor;
   said output terminal being connected to the emitter of the first transistor;
   said first transistor having a predetermined value of beta and being operative when in the second conducting state to produce a current in its emitter circuit having a value equal to the value of the beta of the first transistor times the value of the induced current in its collector-base junction; and
   said resistance in the emitter circuit of the first transistor being operative in response to the current in the emitter circuit of the first transistor to establish an output signal thereacross and at the output terminal indicating that the pulse generator circuit and the first transistor included therein have been exposed to a pulse of nuclear radiation.

9. A pulse generator circuit in accordance with claim 8 wherein the biasing means includes:
   a source of reference potential;
   a voltage supply;
   a resistance coupled between the voltage supply and the base of the second transistor;
   a resistance connected between the emitter of the second transistor and the source of reference potential;
   a resistance connected between the collector of the second transistor and the voltage supply; and
   a resistance connected between the voltage supply and the collector of the first transistor.

10. A pulse generator circuit in accordance with claim 9 wherein:
    the output signal produced at the output terminal has a duration determined by the value of the resistance coupled between the voltage supply and the base of the second transistor and the value of the capacitance in the feedback circuit means interconnecting the collector of the first transistor and the base of the second transistor.

11. A pulse generator circuit in accordance with claim 9 further comprising:
    a test input coupled to the base of the first transistor for receiving a test signal for causing the first transistor to operate in the second conducting state in the absence of the first transistor being exposed to a pulse of nuclear radiation.

12. A pulse generator circuit in accordance with claim 10 wherein
    the first and second transistors are both of the npn type;
    the voltage supply is a positive voltage supply; and
    the first conducting states of the first and second transistors are "off" states and the second conducting states of the first and second transistors are "on" states.

* * * * *